(12) United States Patent
Shin

(10) Patent No.: US 7,368,400 B2
(45) Date of Patent: May 6, 2008

(54) METHOD FOR FORMING OXIDE FILM IN SEMICONDUCTOR DEVICE

(75) Inventor: Seung Woo Shin, Ichon-Shi (KR)

(73) Assignees: Hynix Semiconductor Inc., Kyoungki-do (KR); STMicroelectronics S.r.l., Agrate Brianza (IT)

( * ) Notice: Subject to any disclaimer, the term of this patent is extended or adjusted under 35 U.S.C. 154(b) by 405 days.

(21) Appl. No.: 11/007,181

(22) Filed: Dec. 9, 2004

(65) Prior Publication Data

US 2005/0186806 A1 Aug. 25, 2005

(30) Foreign Application Priority Data

Feb. 23, 2004 (KR) .................. 10-2004-0011754

(51) Int. Cl.
*H01L 21/31* (2006.01)

(52) U.S. Cl. .................. 438/770; 257/E21.625

(58) Field of Classification Search .............. 438/758, 438/763, 770–774
See application file for complete search history.

(56) References Cited

U.S. PATENT DOCUMENTS

| | | | | |
|---|---|---|---|---|
| 3,903,325 A | * | 9/1975 | Horiuchi | .................. 438/770 |
| 5,057,463 A | * | 10/1991 | Bryant et al. | .................. 438/762 |
| 5,849,643 A | * | 12/1998 | Gilmer et al. | .................. 438/773 |
| 5,851,892 A | * | 12/1998 | Lojek et al. | .................. 438/305 |
| 6,180,543 B1 | * | 1/2001 | Yu et al. | .................. 438/787 |
| 6,190,973 B1 | * | 2/2001 | Berg et al. | .................. 438/275 |
| 6,670,242 B1 | * | 12/2003 | Brady et al. | .................. 438/261 |
| 2003/0143863 A1 | * | 7/2003 | Chen et al. | .................. 438/765 |

FOREIGN PATENT DOCUMENTS

KR 1998-55759 11/1998

OTHER PUBLICATIONS

Foreign Office Action for Chinese Patent Application 200510003881.3.

* cited by examiner

*Primary Examiner*—Richard A. Booth
(74) *Attorney, Agent, or Firm*—Lowe Hautpman Ham & Berner LLP

(57) ABSTRACT

The present invention relates to a method for forming an oxide film in semiconductor devices. According to the present invention, after an oxide film is formed, interface trap charge and oxide trap charge can be reduced through a high-temperature thermal treatment process and a pre-treatment thermal process. Further, as an oxide film of a high quality whose trap charge is reduced is formed, reliability of a device is improved and variation in the threshold voltage is prevented.

11 Claims, 2 Drawing Sheets

METHOD FOR FORMING OXIDE FILM IN SEMICONDUCTOR DEVICE

BACKGROUND

1. Field of the Invention

The present invention relates to a method for forming an oxide film in semiconductor devices, and more specifically, to a method for forming a gate oxide film of a transistor or a tunnel oxide film of a flash device, which requires a high quality.

2. Discussion of Related Art

A tunnel oxide film of a conventional flash EEPROM device and a gate oxide film of other memory devices or a logic device require the quality of a high level in view of their applications. Main factors that decide the oxide film of a high quality include the density of interface trap charge and oxide trap charge.

Interface trap charge collectively exists at the boundary where a silicon (Si) substrate and an oxide film are adjacent to each other. Oxide trap charge exist both at the bulk of the oxide film and the boundary of the Si substrate and the oxide film. However, charge in which electrons are trapped mainly exists at the bulk and charge in which holes are trapped typically exists at the boundary of the Si substrate and the oxide film.

Therefore, in order to form the oxide film of a high quality, it is an important technical problem to reduce the density of the interface trap charge and the oxide trap charge. In other words, if an oxide film having a high density of interface trap charge and oxide trap charge is used as a gate oxide film and a tunnel oxide film, there is a problem in that the threshold voltage drift of a transistor occurs due to electric charge trapped in the trap charge. Furthermore, there occurs a problem that breakdown of the oxide film occurs instantly.

SUMMARY OF THE INVENTION

Accordingly, the present invention has been made in view of the above problems, and it is an object of the present invention to provide a method for forming an oxide film in semiconductor devices in which the density of interface trap charge and oxide trap charge can be reduced.

To achieve the above object, according to an embodiment of the present invention, there is provided a method for forming an oxide film in semiconductor devices, comprising the steps of: providing a silicon substrate from which a native oxide film is striped, forming an oxide film on the silicon substrate by performing an oxidization process, and performing a high-temperature thermal treatment process under an atmosphere in which an inert gas and an oxygen gas are mixed in order to reduce trap charge existing within the oxide film.

The method preferably further includes the step of performing a pre-treatment thermal process for reducing interface trap charge between the silicon substrate and the oxide film, after the oxide film is formed.

It is preferred that the pre-treatment thermal process is performed at a temperature of 850 to 950° C. under an $N_2O$ or NO gas atmosphere for about 5 to 15 minutes.

The high-temperature thermal treatment process is preferably performed at a temperature of 950 to 1100° C. under a gas atmosphere in which an oxygen gas is mixed in an inert gas for 5 to 15 minutes.

It is preferable that wherein the oxidization process is performed by allowing hydrogen and oxygen to become steam through reaction at high temperature and then spraying the steam to the surface of the silicon substrate or injecting a TCA or TCE gas in which chlorine is contained in the steam together.

According to another embodiment of the present invention, there is provided a method for forming an oxide film in semiconductor devices, comprising the steps of: loading a silicon substrate into a chamber and then firstly ramping up a temperature within the chamber so that the temperature becomes a first temperature, forming an oxide film on the silicon substrate by performing an oxidization process at the first temperature, secondly ramping up the temperature within the chamber so that the temperature becomes a second temperature, performing a pre-treatment thermal process at the second temperature under an nitrogen gas atmosphere, thirdly ramping up the temperature within the chamber so that the temperature becomes a third temperature, performing a high-temperature thermal treatment process at the third temperature under an atmosphere in which an inert gas and an oxygen gas are mixed, and ramping down the temperature within the chamber so that the temperature becomes an unloading temperature and then unloading the silicon substrate out of the chamber.

It is preferred that the pre-treatment thermal process comprises the steps of stabilizing the temperature within the chamber under an $N_2$ gas atmosphere for about 4 to 6 minutes in order to stabilize the temperature within the chamber, performing annealing under an $N_2O$ or NO gas atmosphere for 5 to 15 minutes, and performing post annealing under an $N_2$ gas atmosphere for 4 to 6 minutes.

The high-temperature thermal treatment process is preferably performed under a gas atmosphere in which an $N_2$ gas and an $O_2$ gas are mixed or under a gas atmosphere in which an Ar gas and an $O_2$ gas are mixed for 5 to 15 minutes.

It is preferable that the first ramp-up process is performed at the rate of 3 to 10° C./min, the second ramp-up process is carried out at the rate of 3 to 10° C./min under an $N_2$ gas atmosphere for 20 to 40 minutes, and the third ramp-up process is performed at the rate of 3 to 10° C./min for 4 to 6 minutes.

It is preferred that the first temperature is 700 to 800° C., the second temperature is 850 to 950° C. and the third temperature is 950 to 1100° C.

DETAILED DESCRIPTION OF PREFERRED EMBODIMENTS

Figure 1:
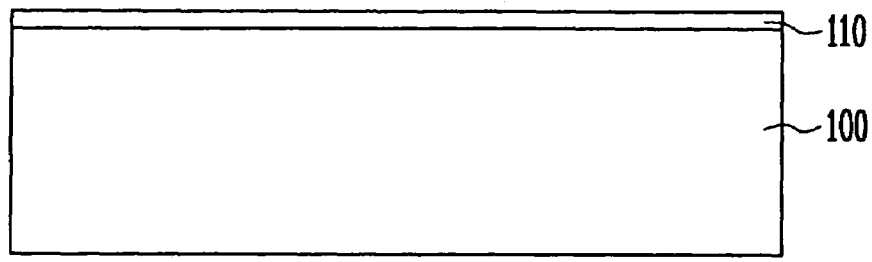
FIG. 1 to FIG. 3 are cross-sectional views shown to explain a method for manufacturing an oxide film according to the present invention.

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later. Like reference numerals are used to identify the same or similar parts.

The density of interface trap charge can be reduced by substituting nitrogen (N) or hydrogen (H) atoms after an oxidization process. Also, in order to reduce the density of oxide trap charge, steam that is produced by allowing $H_2$ and $O_2$ to react to each other under ambient atmosphere upon the oxidization process can be used.

Trap charge by electrons during the oxide trap charge is usually distributed at the bulk of the oxide film. The density of the trap charge varies depending on a process condition during the oxidization process. The trap charge density by these electrons can be reduced through a predetermined thermal treatment process after the oxidization process. The trap charge density by holes can be reduced by supplying sufficient oxygen during the oxidization process or a subsequent thermal process.

Figure 2:
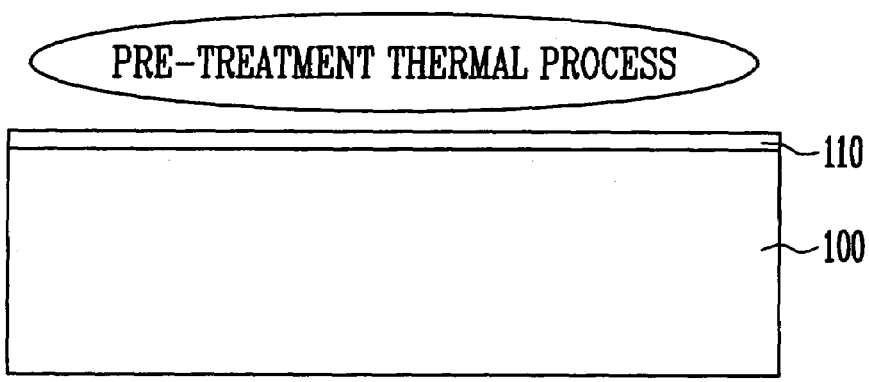
Figure 3:
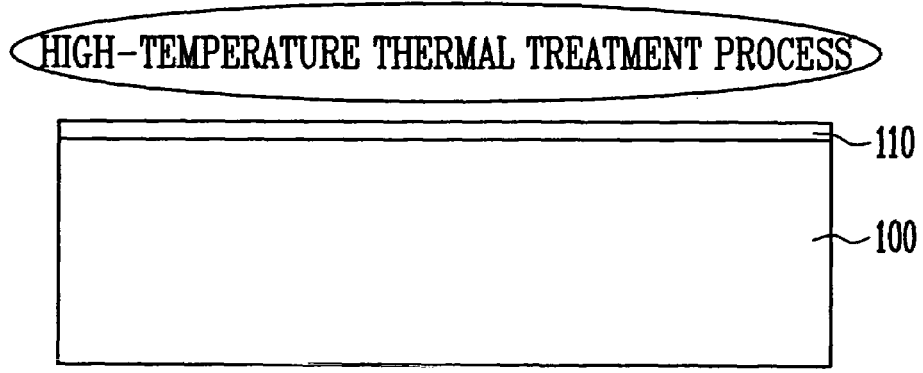
Figure 4:
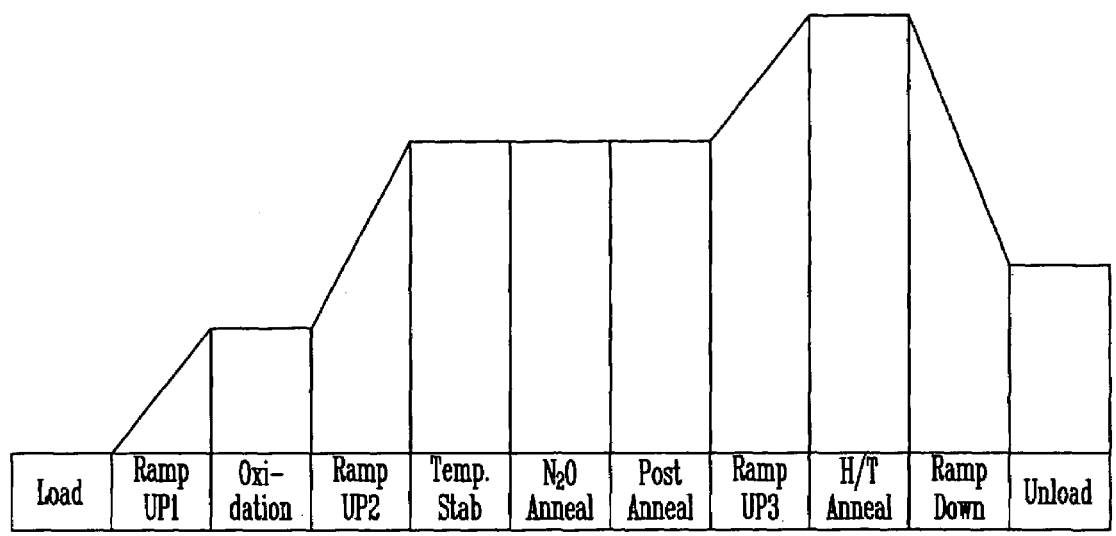
FIG. 4 is a conceptual view for explaining the method for manufacturing the oxide film according to the present invention.

FIG. 1 to FIG. 3 are cross-sectional views shown to explain a method for manufacturing an oxide film according to the present invention. FIG. 4 is a conceptual view for explaining the method for manufacturing the oxide film according to the present invention.

Referring to FIG. 1 and FIG. 4, after a silicon substrate 100 is loaded onto a chamber, an oxide film 110 is formed on the silicon substrate 100 through an oxidization process.

It is preferred that a cleaning process for stripping a native oxide film formed on the silicon substrate 100 is carried out before the silicon substrate 100 is loaded onto the chamber. The cleaning process is preferably performed using a chemical solution such as HF or BOE. If the cleaning process is not performed, there may occur a problem that the film quality of the oxide film 110 formed by a subsequent process is degraded due to the native oxide film remaining on the silicon substrate 100.

After the silicon substrate 100 is loaded onto the chamber, a temperature within the chamber is ramped up so that the temperature becomes a temperature that will be used at the time of an oxidization process. It is preferable that the ramp-up rate is 3 to 10° C./min. It is preferred that the temperature upon the loading is 550 to 700° C., more preferably 620 to 680° C.

The oxidization process can be performed by spraying only oxygen or a mixture of hydrogen and oxygen that becomes steam through reaction at high temperature as an oxidant to the surface of the silicon substrate 100. In this time, it is preferred that the oxidization process is performed by injecting a gas such as TCA or TCE that contains chlorine together in order to reduce mobile ion within the oxide film 110. It is effective to keep the temperature of the oxidization process high in view of characteristics of the film. Accordingly, it is preferred that the temperature of the oxidization process is 700 to 800° C., more preferably 730 to 770° C. If the oxidization process is carried out at the aforementioned temperature, not only the film quality of the oxide film 110 can be formed uniformly, but also bonding can be strengthened. The oxide film 110 having a target thickness can be formed by controlling the oxidization process condition and the oxidization process time. In this embodiment, it is preferred that the oxide film 10 has a thickness of about 30 to 200 Å, more preferably 50 to 130 Å.

If the oxide film 110 is formed through the aforementioned oxidization process, the injection of the oxidant is stopped and the remaining oxidant is then completely discharged from the chamber by injecting an inert gas into the chamber. An $N_2$ gas can be used as the inert gas.

Referring to FIG. 2 and FIG. 4, it is preferred that a pre-treatment thermal process for reducing the interface trap charge is performed under a nitrogen gas atmosphere. The pre-treatment thermal process preferably includes the step of stabilizing the temperature of the chamber, an annealing step, and a post-annealing step.

The temperature within the chamber is ramped up so that it becomes a temperature that will be used at the time of the pre-treatment thermal process. In this embodiment, it is preferred that the temperature of the pre-treatment thermal process is 850 to 950° C. Accordingly, it is preferred that the temperature of the chamber is raised at the ramp-up rate of 3 to 10° C./min under the inert gas atmosphere and is gradually raised to the temperature of the pre-treatment thermal process. More preferably, the temperature within the chamber is ramped up at the ramp-up rate of 4 to 6° C./min for about 20 to 40 minutes. An $N_2$ gas can be preferably used as the inert gas.

After the temperature of the chamber is ramped up, the temperature of the chamber is preferably stabilized under an $N_2$ gas atmosphere for about 4 to 6 minutes. This is for stabilizing instability of the temperature due to the ramp-up.

After the temperature is stabilized, annealing is preferably performed at a temperature of 850 to 950° C. and under an $N_2O$ or NO gas atmosphere for about 5 to 15 minutes. More preferably, in this embodiment, the annealing process is performed for about 8 to 12 minutes. This is for reducing thermal stress due to excessive annealing and effectively substituting the interface trap charge with nitrogen.

After the annealing process, post annealing is preferably performed at a temperature of 850 to 950° C. under an $N_2$ gas atmosphere for 4 to 6 minutes. This is for reducing thermal stress, enhancing a nitrogen substitution effect and discharging the gas used in the annealing process.

By reference to FIG. 3 and FIG. 4, a high-temperature thermal treatment process for reducing the oxide trap charge is carried out.

Before the high-temperature thermal treatment process is performed, a temperature within the chamber is ramped up so that it becomes a temperature that will be used at the time of a high-temperature thermal treatment process. It is preferred that the ramp-up is performed in the rate of 3 to 10° C./min. More preferably, the temperature within the chamber is ramped up in the rate of 4 to 6° C./min for about 4 to 6 minutes. Furthermore, it is preferred that the ramp-up for high-temperature thermal treatment is performed under an inert gas atmosphere or a mixed gas atmosphere in which an inert gas and oxygen are mixed. A nitrogen gas or an argon gas is preferably used as the inert gas. Accordingly, during the ramp-up step, it is possible to prevent holes trap charge from occurring near the boundary of the silicon substrate and the oxide film.

After the ramp-up, the high-temperature thermal treatment process is preferably performed at a temperature of 950 to 1100° C. under a gas atmosphere in which an oxygen gas is mixed into the inert gas in order to reduce the oxide trap charge. In other words, it is preferred that the high-temperature thermal treatment process is carried out under a gas atmosphere in which an $N_2$ gas and an $O_2$ gas are mixed or a gas atmosphere in which an Ar gas and an $O_2$ gas are mixed. Furthermore, the high-temperature thermal treatment process can be performed under an $N_2O$ gas or NO gas atmosphere. The high-temperature thermal treatment process is preferably performed for 5 to 15 minutes. More preferably, in this embodiment, the high-temperature thermal treatment process is performed at the aforementioned temperature and under the above gas atmosphere for 8 to 12 minutes.

If the high-temperature thermal treatment process is performed under the aforementioned process condition, the oxide trap charge within the oxide film 110 can be minimized by supplying sufficient oxygen while applying thermal budget. Detailed effects thereof will be described later on.

After the high-temperature thermal treatment process is performed, the temperature within the chamber is ramped down for a given time and the wafer is unloaded out of the chamber. It is preferred that the temperature of the chamber is ramped down in the rate of 2 to 4° C./min for about 60 to 70 minutes. Upon the ramp-down, the interior of the chamber is preferably an inert gas atmosphere. The temperature when the wafer is unloaded out of the chamber is preferably about 750 to 850° C.

Figure 5:
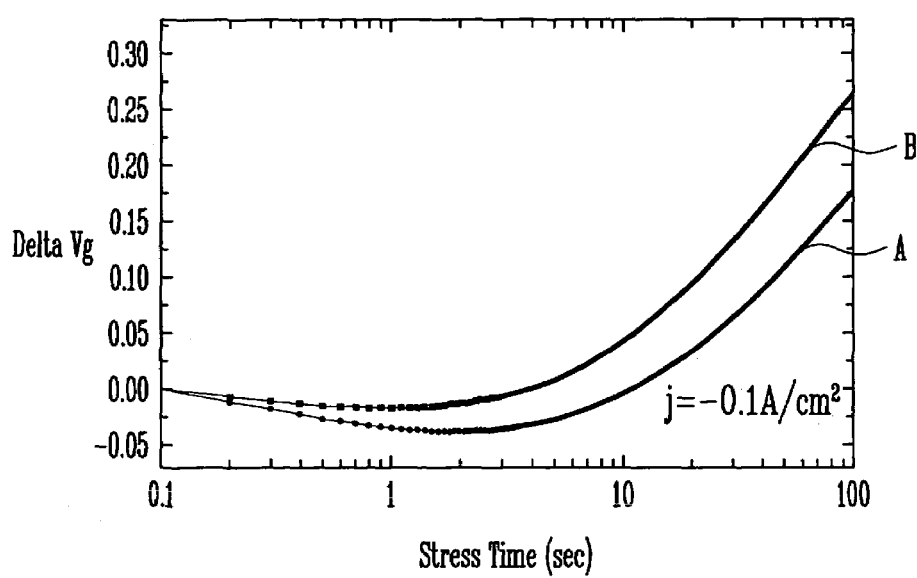
FIG. 5 is a graph illustrating an oxide trap charge level by a thermal treatment process according to the present invention.

FIG. 5 is a graph illustrating an oxide trap charge level by a thermal treatment process according to the present invention.

A graph "A" in FIG. 5 indicates an oxide trap charge level in the case where a high-temperature thermal treatment process is performed at a temperature of 950° C. or more under a gas atmosphere where an inert gas and an oxygen gas are mixed for 10 minutes or more. A graph "B" in FIG. 5 indicates an oxide trap charge level in the case where the high-temperature thermal treatment process is not performed. From FIG. 5, it can be seen that the trap charge level is reduced in the event that the high-temperature thermal treatment process according to the present invention is performed.

According to the present invention described above, after an oxide film is formed, a high-temperature thermal treatment process and a pre-treatment thermal process are performed. It is thus possible to reduce interface trap charge and oxide trap charge.

Further, an oxide film of a high quality whose trap charge is reduced is formed. Thus, reliability of a device can be improved and variation in the threshold voltage can be prevented.

What is claimed is:

1. A method for forming an oxide film in semiconductor devices, comprising the steps of:
    providing a silicon substrate from which a native oxide film is striped;
    forming an oxide film on the silicon substrate by performing an oxidization process at a first temperature;
    performing a pre-treatment thermal process at a second temperature higher than the first temperature; and
    performing a high-temperature thermal treatment process under an atmosphere in which an inert gas and an oxygen gas are mixed at a third temperature higher than the second temperature, and
    wherein the pre-treatment thermal process comprises the steps of:
    stabilizing the second temperature within the chamber under an $N_2$ gas atmosphere;
    performing annealing under an $N_2O$ or NO gas atmosphere; and
    performing post annealing under an $N_2$ gas atmosphere.

2. The method as claimed in claim 1, wherein the annealing under the $N_2O$ or NO gas atmosphere is performed for about 5 to 15 minutes and the second temperature is 850 to 950° C.

3. The method as claimed in claim 1, wherein the high-temperature thermal treatment process is performed under a gas atmosphere in which an oxygen gas is mixed in an inert gas for 5 to 15 minutes and the third temperature is 950 to 1100° C.

4. The method as claimed in claim 1, wherein the oxidization process is performed by allowing hydrogen and oxygen to become steam through reaction at high temperature and then spraying the steam to the surface of the silicon substrate or injecting a TCA (trichloro-ethane) or TCE (trichloro- ethylene) gas in which chlorine is contained in the steam together.

5. A method for forming an oxide film in semiconductor devices, comprising the steps of:
    loading a silicon substrate into a chamber and then firstly ramping up a temperature within the chamber so that the temperature becomes a first temperature;
    forming an oxide film on the silicon substrate by performing an oxidization process at the first temperature;
    secondly ramping up the temperature within the chamber so that the temperature becomes a second temperature;
    performing a pre-treatment thermal process at the second temperature;
    thirdly ramping up the temperature within the chamber so that the temperature becomes a third temperature;
    performing a high-temperature thermal treatment process at the third temperature under an atmosphere in which an inert gas and an oxygen gas are mixed; and
    ramping down the temperature within the chamber so that the temperature becomes an unloading temperature and then unloading the silicon substrate out of the chamber, and
    wherein the pre-treatment thermal process comprises the steps of:
    stabilizing the second temperature within the chamber under an $N_2$ gas atmosphere;
    performing annealing under an $N_2O$ or NO gas atmosphere; and
    performing post annealing under an $N_2$ gas atmosphere.

6. The method as claimed in claim 5, wherein the stabilizing of the second temperature within the chamber under an $N_2$ gas atmosphere is performed for about 4 to 6 minutes, wherein the annealing under the $N_2O$ or NO gas atmosphere is performed for 5 to 15 minutes, and wherein the post annealing under an $N_2$ gas atmosphere is performed for 4 to 6 minutes.

7. The method as claimed in claim 5, wherein the high-temperature thermal treatment process is performed under a gas atmosphere in which an $N_2$ gas and an $O_2$ gas are mixed or under a gas atmosphere in which an Ar gas and an $O_2$ gas are mixed for 5 to 15 minutes.

8. The method as claimed in claim 5, wherein the first ramp-up process is performed at the rate of 3 to 10° C./min, the second ramp-up process is carried out at the rate of 3 to 10° C./min under an $N_2$ gas atmosphere for 20 to 40 minutes, and the third ramp-up process is performed at the rate of 3 to 10° C./min for 4 to 6 minutes.

9. The method as claimed in claim 5, wherein the first temperature is 700 to 800° C., the second temperature is 850 to 950° C. and the third temperature is 950 to 1100° C.

10. The method as claimed in claim 1, wherein the step of performing post annealing under the $N_2$ gas atmosphere is performed for 4 to 6 minutes.

11. The method as claimed in claim 1, wherein the post annealing is performed at the second temperature of 850 to 950° C.

* * * * *